United States Patent [19]

Barker et al.

[11] 4,392,298

[45] Jul. 12, 1983

[54] INTEGRATED CIRCUIT DEVICE CONNECTION PROCESS

[75] Inventors: Robert A. Barker, Plainfield; Edith C. Ong, New Providence, both of N.J.

[73] Assignee: Bell Telephone Laboratories, Incorporated, Murray Hill, N.J.

[21] Appl. No.: 287,439

[22] Filed: Jul. 27, 1981

[51] Int. Cl.³ .............................................. H01L 21/28
[52] U.S. Cl. .................................... 29/577 C; 29/578; 29/591
[58] Field of Search ...................... 29/591, 578, 577 C

[56] References Cited

U.S. PATENT DOCUMENTS

| | | | |
|---|---|---|---|
| 3,838,442 | 9/1974 | Humphreys | 357/54 |
| 3,945,347 | 3/1976 | Takemoto et al. | 29/591 X |
| 3,974,517 | 8/1976 | Sanders et al. | 357/48 |
| 4,046,607 | 9/1977 | Inoue et al. | 148/187 |
| 4,174,562 | 11/1979 | Sanders et al. | 29/591 X |
| 4,211,834 | 7/1980 | Lapadula | 430/326 |
| 4,238,559 | 12/1980 | Feng et al. | 430/156 |
| 4,324,038 | 4/1982 | Chang et al. | 29/591 X |

OTHER PUBLICATIONS

Harada et al., Proceedings of the 6th Conference on Solid State Devices, Tokyo, Japan, 1974, pp. 297–302.

Primary Examiner—G. Ozaki
Attorney, Agent, or Firm—Arthur J. Torsiglieri

[57] ABSTRACT

A method for forming electrical interconnections in an integrated circuit which involves forming an insulating layer on the silicon chip on the lower of two conductive layers to be interconnected, opening a window in the insulating layer, filling the window with a metallic plug by a lift-off technique, and then forming an interconnection pattern extending over the layer and contacting the plug.

4 Claims, 6 Drawing Figures

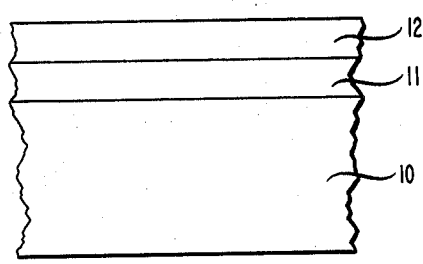
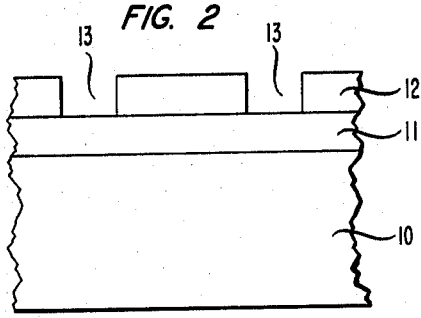
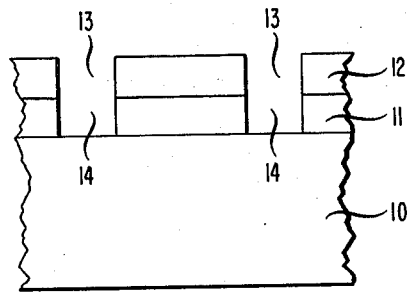
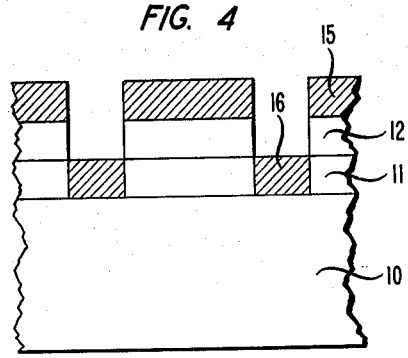
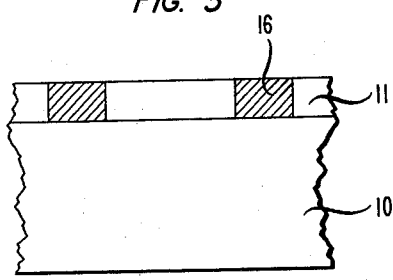
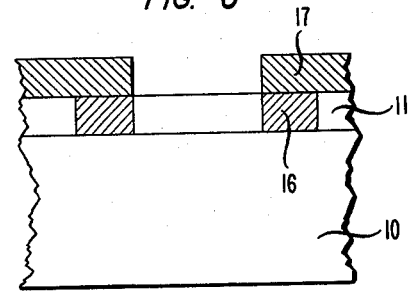

INTEGRATED CIRCUIT DEVICE CONNECTION PROCESS

TECHNICAL FIELD

This invention relates to the fabrication of integrated circuit devices and more particularly to the provision of electrical connections in such devices.

BACKGROUND OF THE INVENTION

In the typical integrated circuit device, a silicon chip is provided with a number of regions of different characteristics to provide a number of circuit elements, and on one surface of the chip there is included an interconnection pattern of electrical conductors which interconnect the various circuit elements in a prescribed fashion to achieve a desired circuit arrangement.

Typically, the interconnection pattern comprises a plurality of conductive lines or runners, on one or more levels, which have been patterned from metallic layers deposited on a dielectric coating on the silicon chip and which make low resistance connection to the silicon chip, or between different levels, by way of openings or windows in the dielectric coating. Often in high density integrated circuits at least some of the runners are of aluminum, usually including traces of copper and silicon, and the dielectric coating comprises a silica glass, usually phosphorus-doped. In a typical design, the windows may be only several microns in diameter and with a height of between one and two microns.

To maximize the density of components in a chip, it is known to be desirable to use windows with straight vertical walls or edges. However, it is difficult to achieve consistently reliable electrical connection through windows of this kind. Accordingly, to improve the reliability of such connections, it is customary to make a so-called "nailhead" connection which comprises an enlarged square end portion which overlies the window with considerable overlapping of the window edges. For example, for a 3.5 microns diameter window, it is customary to use a 5 microns square nailhead end portion attached to a 3.5 microns runner. This extra width for the nailhead portion tends to reduce the density of elements which can conveniently be included in a chip.

SUMMARY OF THE INVENTION

My invention relates to the formation of a metallic plug, preferably aluminum, to fill the window, and more particularly is a process for doing this conveniently. The use of a plug improves the reliability of a connection and minimizes the need for a nailhead.

In accordance with an illustrative embodiment of my invention, the glass-coated silicon chip is covered with a masking layer which is patterned to correspond to the openings desired in the glass coating. Then the glass coating is anisotropically etched to form windows with substantially vertical sidewalls to expose silicon where electrical connection is to be made. Then with the mask still in place, aluminum is deposited over the chip, the deposition technique being chosen to provide vertical deposit of the aluminum to ensure good coverage of the bottom of each window. The aluminum is deposited to substantially the thickness of the glass layer. Then the masking layer is removed, lifting off the aluminum deposited on it and leaving aluminum only as plugs filling the windows. The choice of the masking layer and the geometry of the windows are designed to facilitate a lift-off process for removal of the undesired subsequently-to-be-deposited aluminum. Advantageously there is employed the two-level lift-off process disclosed in commonly assigned copending application Ser. No. 191,493, filed Sept. 29, 1980, by L. A. Fetter, T. M. Mayer, E. C. Ong, E. Reichmanis, and C. W. Wilkins Jr. (now abandoned). Then aluminum runners connecting to the aluminum plugs are formed in the usual fashion with the difference that because of the better electrical connection provided to the silicon chip by the plugs, it is normally unnecessary to provide the large nailhead portions where the runners connect to the plugs.

BRIEF DESCRIPTION OF THE DRAWING

FIGS. 1 through 6 show a silicon chip being provided with an interconnection pattern in accordance with an illustrative embodiment of the invention. The drawing is not to scale.

DETAILED DESCRIPTION

FIG. 1 shows a portion of a monocrystalline silicon chip 10 which has been treated to incorporate significant impurities (not shown) selectively in localized regions to form electrical circuit elements which are to be formed into desired integrated circuits, such as memories, gate arrays, and custom circuits, by an interconnection system which includes at least one set of electrical conductors patterned from a metallization layer deposited over one major surface of the chip but isolated electrically from the chip except at localized regions where electrical connection to the chip is desired.

To provide the electrical isolation there is first provided a continuous dielectric layer 11 over the appropriate portion of the major surface of the chip. This dielectric layer typically may be silicon dioxide, doped-silica glass, or a composite layer including an inner portion of silicon dioxide and an outer portion of silicon nitride.

In most instances there would have previously been formed one or more lower level conductive interconnection patterns in which case the aluminum interconnection pattern being described as illustrative of the invention would be second or higher level of interconnections.

In such a case, layer 11 may overlie lower level metallization and not be essentially contiguous to the silicon substrate. For present purposes, it will be convenient to discuss specifically the situation where layer 11 overlies the silicon or is separated therefrom only by a thin silicon oxide layer, such as the thin oxide layer used as the gate insulator in an MOS transistor. However, the same principles are applicable when layer 11 overlies a conductive layer, such as of polysilicon, to which an aluminum layer is to make connection by way of a window in layer 11.

To permit electrical connection to the chip, it will be necessary to provide openings in layer 11 to the bare silicon. In integrated circuits where high density of circuit elements is desired, it is important that the openings in the layer 11 have substantially vertical sidewalls; and, accordingly, the layer 11 should be patterned by a technique that results in openings with substantially vertical sidewalls. Presently this is best achieved by anisotropic reactive ion etching.

We find it generally advantageous, when the layer 11 is not completely planar as is typically the case, to use a bilevel resist technique of the kind described in the aforementioned copending application for providing a mask for localizing the reactive ion etching of the layer 11, particularly when it comprises largely 6% phosphorus-doped silica glass. This involves depositing a relatively thick 2 micron layer of a first resist, such as PMMA, primarily sensitive to ultraviolet radiation, followed by a relatively thin 5000 Angstrom layer of a second resist such as HPR204, sensitive to visible light. The thicker layer serves to smooth any irregularities in layer 11 and to provide a planar surface for the thinner layer so that its features can be patterned more precisely. The dual resist layer is shown simply as the layer 12 in FIG. 1.

This layer 12 is patterned in appropriate fashion, for example as described in the copending application, to form a pattern of openings 13 about 3.5 microns square corresponding to the openings desired in the glass layer 11, as seen in FIG. 2. In particular the thinner layer is patterned first by selective irradiation with visible light and development of the pattern. The thicker layer is then patterned by uniform illumination with ultraviolet light and development.

Thereafter, the chip with the patterned layer 12 as a mask is subjected to anisotropic reactive ion etching, typically in a $CHF_3$ ambient, to form corresponding openings or windows 14 in the layer 11 as seen in FIG. 3. The parameters of the etching are chosen appropriately to result in openings with substantially vertical sidewalls.

The chip with the apertured layers 11 and 12 is then treated for the deposition of an aluminum metal layer over the appropriate portion of its major surface. In some instances, particularly where the aluminum is to make connection to shallow doped regions and it is important to minimize the formation of aluminum spikes which undesirably penetrate completely the shallow doped regions, it may be advantageous to treat the silicon exposed at the openings in a manner to reduce the spiking effect before depositing any aluminum. Such a treatment might include use of a preliminary layer of cobalt to form cobalt silicide at the exposed silicon to serve as a barrier to any spiking. Alternatively, polysilicon has been proposed for this purpose.

In some instances where it is desired to minimize the contact resistance, it may be preferable not to include polysilicon in the window area but rather to provide it only in areas bordering the window where it is nevertheless still available as a source of silicon for the aluminum to lessen the amount of silicon taken from the window area when the aluminum is later exposed to a heat treatment which causes alloying of the aluminum to silicon.

The aluminum deposition treatment advantageously is one that permits uniformly good coverage of the silicon exposed at the openings in the layers 11 and 12. This typically involves use of a deposition machine which provides aluminum particles traveling normal to the chip so as to penetrate the opening in a fashion to minimize sidewall buildup of aluminum. Sidewall buildup is undesirable if it restricts the size of the opening and causes incomplete aluminum coverage of the bottom of the opening. The specific operating conditions to maximize the bottom coverage and fill of the opening are best derived experimentally for a particular deposition apparatus and window opening geometry.

The aluminum is deposited to a thickness substantially that of the layer 11 and less than the combined thickness of layers 11 and 12 as seen in FIG. 4. As a result the aluminum layer 15 tends to be substantially discontinuous along the sidewalls of the openings, comprising the portion 15 over the layer 12 and the plug 16 in the windows.

Then there is removed the layer 12 and with it the overlying aluminum layer 15. Advantageously, as previously mentioned, the layer 12 has been chosen to permit lift-off removal of layer 15. To this end, advantageously layer 12 is of a material vulnerable to a wet etchant which little affects aluminum or the layer 11. As a consequence, as the layer 12 is attacked by such an etchant, there is also lifted off the supported aluminum layer 15, while the aluminum plug 16 remains unaffected. In the aforementioned copending application, a suitable technique is described in detail. In FIG. 5 there is shown the resultant. It includes the chip 10, the layer 11, and the aluminum plug 16 filling the opening in layer 11 so as to form a substantially planar surface. Typically, the contact will be exposed to a heat treatment to alloy the aluminum to silicon in the window.

There remains to be provided the various runners connecting the plugs either to other plugs or to other connection points.

To this end, there is deposited a metal layer, advantageously also of aluminum, uniformly over the major surface; and this layer thereafter is patterned in the usual fashion to form the desired metallic runners. In FIG. 6, there is shown two runners 17 overlying layer 11, each making a direct electrical connection to a plug 16.

It should be apparent that various modifications are available within the spirit of the invention. In particular when interconnection is to be made between two separate levels of conductors, as is characteristic of some high density dynamic random access memories, a polysilicon plug may be preferred, particularly if either or both of the levels use polysilicon conductors.

What is claimed is:
1. The method of forming electrical connections in an integrated circuit device comprising the steps of
    preparing an integrated circuit device comprising a silicon chip which includes a dielectric coating,
    providing a two-level photosensitive masking layer over the dielectric coating of which the first level is sensitive to ultraviolet light and the second level is sensitive to visible light,
    patterning said masking layer in accordance with the pattern of openings desired in the dielectric coating to permit connection therethrough by first irradiating with visible light and patterning the second level and then irradiating with ultraviolet light and patterning the second level,
    making openings in said coating in accordance with the pattern by reactive ion etching to provide substantially vertical sidewalls in the openings,
    depositing a conductive layer over the masking layer and in the openings in the dielectric coating of a thickness substantially to match the thickness of the dielectric coating,
    dissolving the masking layer, thereby lifting off the overlying portion of the conductive layer, while leaving a plug portion of the conductive layer in the opening in the dielectric coating, and
    forming over the dielectric coating a conductive layer which makes low resistance connection to the plug portion.
2. The method in accordance with claim 1 in which the first-mentioned conductive layer is aluminum.

3. The method in accordance with claim 2 in which the second-mentioned conductive layer is also aluminum.

4. The method in accordance with claim 3 in which the dielectric coating is phosphorus-doped silicon oxide and reactive ion etching is used to make the openings therein.

* * * * *